US009677883B2

(12) United States Patent
Giger et al.

(10) Patent No.: US 9,677,883 B2
(45) Date of Patent: Jun. 13, 2017

(54) DISTANCE MEASURING DEVICE

(71) Applicant: LEICA GEOSYSTEMS AG, Heerbrugg (CH)

(72) Inventors: Kurt Giger, Rüthi (CH); Reto Metzler, Rebstein (CH); Bernhard Fiegl, Marbach (CH)

(73) Assignee: LEICA GEOSYSTEMS AG, Heerbrugg (CH)

( * ) Notice: Subject to any disclaimer, the term of this patent is extended or adjusted under 35 U.S.C. 154(b) by 454 days.

(21) Appl. No.: 14/362,098

(22) PCT Filed: Nov. 30, 2012

(86) PCT No.: PCT/EP2012/074170
§ 371 (c)(1),
(2) Date: May 30, 2014

(87) PCT Pub. No.: WO2013/079706
PCT Pub. Date: Jun. 6, 2013

(65) Prior Publication Data
US 2014/0327902 A1  Nov. 6, 2014

(30) Foreign Application Priority Data

Dec. 1, 2011  (EP) .................................... 11191588

(51) Int. Cl.
*G01C 3/08* (2006.01)
*G01S 17/08* (2006.01)
*G01S 7/481* (2006.01)

(52) U.S. Cl.
CPC .............. *G01C 3/08* (2013.01); *G01S 7/4814* (2013.01); *G01S 17/08* (2013.01);
(Continued)

(58) Field of Classification Search
CPC ......... G01C 3/08; G01S 7/4814; G01S 17/08; G01S 7/497
(Continued)

(56) References Cited

U.S. PATENT DOCUMENTS 6,111,272 A * 8/2000 Heinen ............... H01L 33/0079
257/94
7,192,201 B2 3/2007 Kato et al.
(Continued)

FOREIGN PATENT DOCUMENTS

CN     2038678 U   5/1989
CN     2796195 Y   7/2006
(Continued)

OTHER PUBLICATIONS

European Search Report dated May 8, 2012 as received in Application No. EP 11 19 1588.

*Primary Examiner* — Luke Ratcliffe
(74) *Attorney, Agent, or Firm* — Maschoff Brennan

(57) ABSTRACT

The invention relates to an optoelectronic distance measuring device, comprising a transmitting unit and comprising a receiving unit of an electronic evaluating unit. The transmitting unit has a circuit board, a semiconductor laser, and a laser diode driver for transmitting high-frequency intensity-modulated optical radiation. In order to receive a component of the optical radiation reflected by a target object by means of a photosensitive electrical component, the receiving unit is equipped with an electrical output signal as a received signal, a conditioning unit for conditioning the received signal, and an analog/digital converter for digitizing the conditioned received signal. The electronic evaluating unit determines a distance from the distance measuring device to the target object on the basis of a signal propagation time using the digitized received signal. The semicon- (Continued)

ductor laser is attached to the circuit board as a laser substrate that does not have a housing.

30 Claims, 11 Drawing Sheets

(52) U.S. Cl.
CPC ............... *H01L 2224/48227* (2013.01); *H01L 2924/3011* (2013.01); *H01L 2924/3025* (2013.01)

(58) Field of Classification Search
USPC ......................................................... 356/5.01
See application file for complete search history.

(56) References Cited

U.S. PATENT DOCUMENTS

| | | | |
|---|---|---|---|
| 7,684,058 | B2 | 3/2010 | Sprenger |
| 8,432,535 | B2 | 4/2013 | Yang |
| 2007/0200949 | A1 | 8/2007 | Walker et al. |
| 2009/0065800 | A1 | 3/2009 | Wirth et al. |
| 2011/0051122 | A1* | 3/2011 | Yang ........................ G01C 3/08 356/5.09 |
| 2011/0057104 | A1 | 3/2011 | Yao et al. |

FOREIGN PATENT DOCUMENTS

| | | |
|---|---|---|
| CN | 101238389 A | 8/2008 |
| CN | 101330194 A | 12/2008 |
| CN | 101996892 A | 3/2011 |
| CN | 10 20 04 253 A | 4/2011 |
| DE | 20 2010 008 426 U1 | 1/2011 |
| EP | 0 905 797 A2 | 3/1999 |
| EP | 1 957 668 A1 | 8/2008 |
| EP | 1 987 668 A1 | 11/2008 |
| EP | 2 183 865 A1 | 5/2010 |
| EP | 2 589 980 A1 | 5/2013 |
| EP | 2 600 168 A1 | 6/2013 |
| EP | 2 568 547 A1 | 7/2014 |
| JP | 2004-356230 A | 12/2004 |
| WO | 2005/081319 A1 | 9/2005 |
| WO | 2006063740 | 3/2006 |
| WO | 2006/063740 A1 | 6/2006 |
| WO | 2007/022927 A1 | 3/2007 |
| WO | 2007022927 A1 | 3/2007 |
| WO | 2011/076907 A1 | 6/2011 |

\* cited by examiner

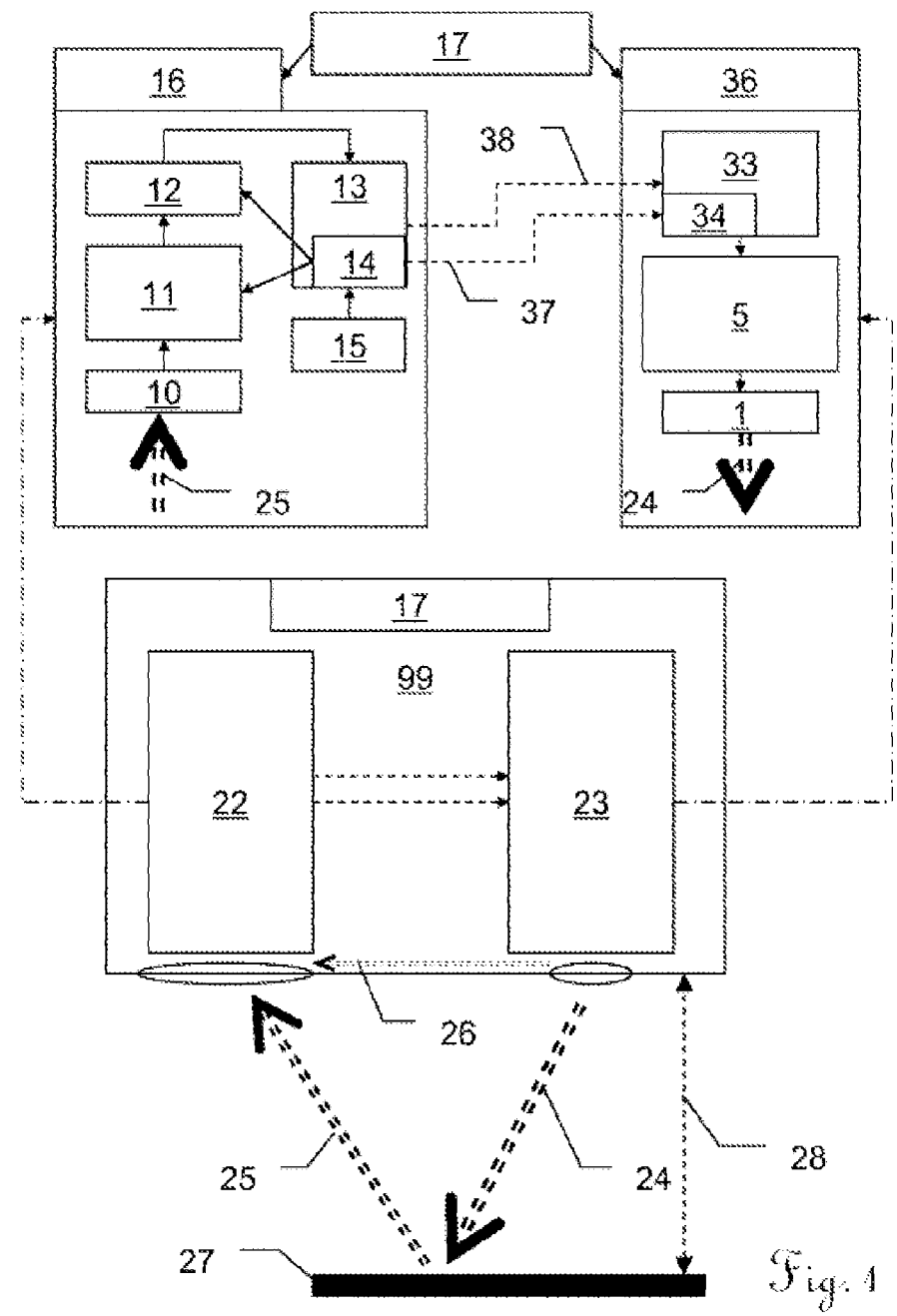

DISTANCE MEASURING DEVICE

FIELD OF THE INVENTION

The invention relates to a distance measuring device, especially to a transmitting unit of such a distance measuring device, and to a method for producing a transmitting unit.

BACKGROUND

In optoelectronic distance measuring devices (EDM), an optical signal is emitted from the instrument in the direction of the target object—whose distance it is necessary to determine—for example as optical radiation in the form of laser light. In order that the point targeted for measurement on the target object is made discernible, visible light is often used in this case. The surface of the target object reflects at least part of the optical signal, usually in the form of a diffuse reflection. The reflected optical radiation is converted into an electrical signal by a photosensitive element in the instrument. With knowledge of the propagation velocity of the optical signal and with the aid of the ascertained propagation time required for covering the distance from the instrument to the target object and back, it is possible to determine the distance between instrument and target object. In this case, optical components for beam shaping, deflection, filtering, etc.—such as, for instance, lenses, wavelength filters, mirrors, etc.—are usually situated in the optical transmission and/or reception path.

In order to compensate for influences which might corrupt the measurement results (for example temperature influences, component tolerances, drifting of electronic components, etc.), part of the emitted optical signal can be guided as a reference signal via a reference path of known length from the light source to the light-sensitive receiving element. In this case, the reference path can be fixedly incorporated in the instrument or be designed as a deflection element that can be pivoted in or plugged on, for example. The reception signal resulting from said reference signal can be received by the photosensitive element used for measurement or by a dedicated photosensitive element. The resulting electrical reference signal can be used for referencing and/or calibrating the measured values ascertained.

In order to obtain a correspondingly high accuracy of the distance measurement, on account of the high propagation velocity of optical radiation, the requirements made of the temporal resolution capability for distance measurement are extremely high. By way of example, for a distance resolution of 1 mm, a time resolution having an accuracy of approximately 6.6 picoseconds is required.

With regard to the signal power that can be emitted, limits are predefined for the optoelectronic EDM under consideration here. In this regard, when laser light is emitted, eye safety determines a maximum permissible average signal power which is allowed to be emitted. In order nevertheless to obtain for the measurement sufficiently strong signal intensities which can be detected by the receiver, pulsed operation is therefore employed. The emitted optical signal is modulated in its intensity amplitude. Short pulses having a high peak power are emitted, followed by pauses without signal emission. Consequently, the reflected portion of the pulses has a sufficiently high intensity to be able to evaluate the latter from the background disturbances and noise, in particular even when background light (sunlight, artificial lighting, etc.) is present.

As described in EP 1 957 668, for instance, the emission of packets of pulses followed by pauses without pulse emission—so-called burst operation—especially affords not only the advantage of a reduced average power of the signal, but additionally also advantages in the achievable signal-to-noise ratio (SNR). Firstly, therefore, the signal intensity can be correspondingly higher during the active burst time than in the case of continuous emission—without exceeding the average power limit in the process. Secondly, moreover, the noise is taken up only in the time windows during the active burst duration—but not during the blanking intervals, since no signal evaluation takes place during the latter. By means of a duty cycle of the bursts e.g. of 0.1 or 1:10 or 10% (10% of the burst duration signal emission+90% pause), it is thus possible to achieve an improvement in the SNR of approximately the square root of 1/duty cycle, that is to say in the example of 10% an improvement by a factor of more than 3. The number of pulses per packet can be varied depending on the evaluation concept and measurement situation, through to individual pulses (in which case the term bursts is then generally no longer employed).

In order to ascertain the propagation time of the signal, firstly the so-called time-of-flight (TOF) method is known, which ascertains the time between the emission and reception of a light pulse, wherein the time measurement is effected with the aid of the edge, the peak value or some other characteristic of the pulse shape. In this case, pulse shape should be understood to mean a temporal light intensity profile of the reception signal, specifically of the received light pulse—detected by the photosensitive element. In this case, the point in time of transmission can be ascertained either with the aid of an electrical trigger pulse, with the aid of the signal applied to the transmitter, or with the aid of the reference signal mentioned above.

In the distance measurement, ambiguities can occur if the signal propagation time exceeds the reciprocal of the pulse or burst transmission rate and a plurality of signals are thus traveling simultaneously between instrument and measurement object, as a result of which a reception pulse or reception burst can no longer be assigned unambiguously to its respective transmission pulse or transmission burst. Without further measures it is thus unclear whether actually the determined distance or an integral multiple thereof was measured.

Secondly, the so-called phase measurement principle is known, which ascertains the signal propagation time by comparison of the phase angle of the amplitude modulation of the transmitted and received signals. In this case, however, the measurement result in the case of one transmission frequency has ambiguities in units of the signal period duration, thus necessitating further measures for resolving these ambiguities. By way of example, WO 2006/063740 discloses measurement with a plurality of signal frequencies which result in different unambiguity ranges, as a result of which incorrect solutions can be precluded. WO 2007/022927 is also concerned with unambiguities in phase measurement.

The described pulsed or burst operation of the distance measuring device requires the emission of short light pulses, that is to say a high modulation frequency of the emitted light. The EDM design presented below with specific numerical values shall be set out by way of example as one possible specific embodiment. The numerical values used in this case should be regarded in this case primarily as guide values for the orders of magnitude and size ratios of the signals with respect to one another, rather than as exhaustive, limiting indications of values. The orders of magnitude and numerical values indicated here are purely by way of example in order to illustrate a posed problem that is solved according to the invention. Practical examples of modulation frequencies in EDMs are in the 100 MHz to 10 GHz range, especially approximately 500 MHz to 1 GHz. In the case of transmitting elements in the form of semiconductors, this is obtained by means of correspondingly fast electrical driving. In order to achieve the required high peak power of the optical pulses in this case, therefore, the laser driver has to impress short electrical pulses having high current intensities into the light source.

By way of example, pulse durations in the range of nanoseconds or less, especially approximately 1 to 0.1 nanosecond or less, are customary values. The peak currents to be impressed in this case are in this case approximately in the range of some milliamperes, for example approximately 10 mA to 1 A, especially approximately 50 to 300 mA. In the case of an exemplary current pulse having a triangular shape and a peak value of 100 mA with a duration of 1 ns, this produces a current rise of an order of magnitude of $10^8$ amperes per second. Given a total inductance of the drive circuit (in particular comprising laser diode, leads, driving circuit) of 10 nH, this already produces a voltage drop of the order of magnitude of the laser threshold voltage of the laser diode (of e.g. typically approximately 2.3V in the case of red laser diodes). In order for example to generate an approximately rectangular optical pulse, the requirements are correspondingly even higher, such that even a few nanohenries of lead inductance become apparent in the emitted pulse shape. Customary housing connections of laser diode components and also the bonding wires in the component themselves often already have an inductance of the order of magnitude of 5 to 10 nH, however, that is to say make up a considerable proportion of the inductive behavior of the drive circuit.

Purely in the context of the use of a laser driver or laser diode driver such as is disclosed for example in European patent application No. 11180282 (the content of which is incorporated by reference herein), a low lead capacitance of the laser diode is of importance. By virtue of the drive principle used therein with a supply voltage below the laser threshold voltage, parasitic inductances of the laser diode, or to put it more precisely of the leads thereof, have an even more problematic effect than in conventional laser drivers. However, in conventional laser diode drivers, too, a low inductance of the laser diode and the electrical connections thereof has a positive effect. Besides a metrological appreciation of this problem area, the topic of the lead inductance during the pulsed operation of laser diodes is also discussed for example in the TechNote TN #36000-2 from ILX Lightwave (www.ilxlightwave.com), wherein the dimensions and power classes described therein do not apply in the technical field of distance measuring devices. Especially for handheld, compact, battery-operated EDMs, the teaching presented therein is not applicable, in particular since the power classes are totally different and no standard connection cables described therein are used anyway.

The laser diodes according to the prior art, for instance as described in U.S. Pat. No. 7,192,201, have, owing to the dictates of construction, a parasitic inductance that is extremely high for the case of use described here. Contrary to the present application, said document even describes the introduction of an inductance into the laser diode.

In the case of such laser diodes used in the prior art, the parasitic inductance is high owing to the dictates of design, especially as a result of the comparatively long leads, bonding wires, etc. For high-frequency modulated EDMs, the inductive properties of these components are noticeably disturbing and should not be disregarded in the context of optimizing the EDM system.

Crosstalk effects in electronics also constitute a further limiting factor with regard to achieving high distance accuracies in the prior art. In this case, firstly, the transmitter with the short pulses having high amplitude values as desired in a manner governed by the use is a potential broadband interference source. In this case, the connections act as "transmitting antennas" which emit this electromagnetic interference.

CN 10 20 04 253 describes a distance measuring device comprising a laser diode, in which, opposite the primary measurement radiation emission, a smaller, secondary part of the radiation is likewise coupled out to a reference photodiode in order to form a reference path. The monitor diode usually fitted at this location in the case of laser diodes in the prior art is therefore replaced by a reference signal receiver. To put it another way, therefore, in this case the reference radiation is not derived at the front from the primary measurement beam, but rather at the back from the secondary monitor beam.

SUMMARY

Some embodiments of the present invention may improve an optoelectronic distance measuring device, in particular to achieve an increase in the distance measuring accuracy, the measuring rate and/or an increase in the signal quality of the emitted light pulses.

Some embodiments may improve the emission of light pulses in the EDM, in particular also with regard to reducing electromagnetic interference emissions, also for improving the achievable signal/noise ratio of the distance measurement.

Some embodiments may improve and simplify the transmitting unit of a distance measuring device, especially from economic standpoints, such as simplified assembling during the production of instruments, miniaturization, reducing the number of components and component costs.

Some embodiments may optimize a transmitting unit with a laser driver without a monitor diode. Some embodiment may allow a transmitting unit to use lower drive voltages.

Some embodiments may include obtaining an advantageous mounting and geometrical arrangement for the semiconductor light source on the printed circuit board, in particular with regard to complying with dimensional tolerances, avoiding shading of the emitted light beam and/or mechanically protected positioning of the light source at the edge of the printed circuit board.

Some embodiments may include an optoelectronic distance measuring device that may include a laser distance measuring device, designated as EDM (electronic distance measuring device) or LRF (laser range finder), may include:

A transmitting unit comprising a printed circuit board, a semiconductor laser and a laser diode driver for emitting high-frequency intensity-modulated optical radiation. In this case, the high-frequency optical radiation can be shaped in particular as burst-modulated radiation having a burst rate, a burst duty cycle and a pulse frequency within a burst or else as individual or continuously successive light pulses having a short time duration.

A receiving unit for receiving a portion of the optical radiation, said portion being reflected from a target object, by means of a photosensitive electrical component with an electrical output signal as reception signal.

The photosensitive component can be in particular a photodiode, especially an APD. The receiving unit is also equipped with a conditioning unit for conditioning the reception signal and an analog-to-digital converter for digitizing the conditioned reception signal.

An electronic evaluation unit, which ascertains a distance from the distance measuring device to the target object on the basis of a signal propagation time with the aid of the digitized reception signal.

According to the invention, the semiconductor laser is applied as a laser substrate without a housing as it were directly to the printed circuit board. In particular, the semiconductor laser can be applied electrically conductively. By way of example, in this case, the laser substrate can also be electrically connected to the printed circuit board or the laser diode driver directly by means of a bonding wire.

In this case, as it were the laser substrate and at least one power part or an output stage of the laser diode driver are arranged on the same printed circuit board.

In this case, the laser substrate can be positioned at the edge of a hole divided by a printed circuit board edge, in order to increase the mechanical positional accuracy and to prevent partial masking of the emission angle, and also in order to afford mechanical protection for the emitting end face. In this case, the hole can be a hole that is drilled during printed circuit board production, such as is also customary for instance as a standard process for the through hole mounting of electronic components with high positional accuracy. In this case, the edge of the printed circuit board can be scribed, milled or laser-cut with lower accuracy.

The laser substrate has a first and a second electrical connection, which are both electrically connected to the laser driver.

In the case of the laser substrate, a first semiconductor layer as first connection can be removed, in particular chemically or mechanically (e.g. by etching, milling, grinding, laser engraving, etc.), in a partial region of said semiconductor layer, such that a part of the opposite second semiconductor layer as second connection is exposed and contact-connectable. The laser substrate can thus be contact-connected from the side of the first semiconductor layer at the first and second connections. In this case, in particular, the laser substrate can be mountable as a so-called flip-chip electrically conductively on the printed circuit board or the laser driver, specifically wherein the first and second connections can be provided with at least one ball contact and by means of the latter are adhesively bondable or solderable conductively onto the printed circuit board or the laser driver.

The laser substrate, as first connection, can be applied electrically conductively on the printed circuit board, for example adhesively bonded, bonded or soldered electrically conductively onto the printed circuit board. If appropriate, an insulating or conductive intermediate element can be used in this case.

The laser substrate, as second connection, can be contact-connected onto the printed circuit board by means of a bonding wire or contact-connected onto the printed circuit board by means of an electrically conductive contact strip, in particular a resilient element.

In one embodiment, the laser substrate can also be introduced with the connections laterally—that is to say as it were edgewise—into a slot in the printed circuit board and be contact-connected laterally in each case by conductor tracks, in particular by soldering or conductive adhesive bonding. In another embodiment, the laser substrate can also be plugged in between two contacts on the printed circuit board which make contact (e.g. somewhat resiliently) with the first and second connections. The contacts can also ensure the positioning and the plugged-in laser substrate can be fixed between the contacts e.g. by adhesive bonding. In this case, the contacts can also function as a heat sink for the laser substrate.

The printed circuit board can additionally be configured for dissipating waste heat of the laser substrate, in particular with corresponding conductor track areas, vias for dissipation and distribution of the heat into lower conductor track layers and/or by means of a heat sink fitted (e.g. soldered) on the printed circuit board.

In accordance with one part of the invention, the contact-connection of the semiconductor substrate is effected in such a way that its lead impedance is reduced compared with a housing-encapsulated laser diode, in particular by virtue of a shortened lead length from the laser driver to an electrical connection of the laser substrate, for example by the direct bonding of the connection of the laser substrate onto the printed circuit board or the laser driver.

In accordance with one embodiment, the transmitting unit can be embodied without a monitor diode. In this case, the laser safety guidelines are fulfilled without a monitor diode, for example by the laser driver being operated with a supply voltage below a laser threshold of the semiconductor laser. Especially in such a configuration, the lead impedance to the light-emitting semiconductor may be of importance for generating short light pulses.

A transmitting unit, in particular for the high-frequency pulsed operation of a laser diode, for a distance measuring device according to the invention, comprising a printed circuit board as a carrier element, a laser driver as an electronic circuit, and a semiconductor laser substrate without a housing, which substrate is applied on the printed circuit board, is also described according to the invention. In this case, the semiconductor laser substrate can be applied in particular directly to the printed circuit board. In this case, the transmitting unit can be a preassembled assembly of the EDM.

Accordingly, the invention also relates to a method for producing such a transmitting unit. In this case, the method comprises at least producing a printed circuit board of the transmitting unit,
applying the semiconductor light source as a laser substrate without a housing to the printed circuit board, for example by conductive adhesive bonding, soldering or friction bonding, and
contact-connecting at least one electrical connection of the laser substrate onto the printed circuit board by means of a die bonding process, for example by means of at least one bonding wire.

The method, especially applying the semiconductor light source, can also be effected by means of positioning the semiconductor light source at the edge of an end-side indentation, in particular at the edge of a segment of a drilled hole of the printed circuit board.

The invention furthermore relates to a method for reducing an impedance, in particular a parasitic lead inductance, of a semiconductor light source in a transmitting unit of an EDM, by means of which high-frequency, steep-edged light pulses can be emitted, by a procedure involving applying the semiconductor light source as a laser substrate without a housing to a printed circuit board (e.g. by conductive adhesive bonding, soldering, friction bonding, etc.).

This can involve directly contact-connecting at least one electrical connection of the laser substrate onto the printed circuit board by means of a die bonding process, in particular by means of at least one bonding wire.

An optoelectronic distance measurement using the burst principle described can also be utilized to the effect of carrying out an evaluation with simultaneous coarse and fine measurement. As described, a TOF measurement of light pulses or pulse packets with correspondingly high temporal pulse spacing is well suited for obtaining an unambiguous distance measurement, but a high-resolution time measurement of an individual pulse within the packet can be realized only to a limited extent, which is why this is designated as coarse measurement.

In contrast thereto, a high time resolution can be obtained by a so-called fine measurement by means of digitizing the pulse shape of the individual pulses and determining the phase angle of one or more pulses. However, in the case of relatively large measurement ranges, on account of the signal periodicity, said resolution cannot be assigned unambiguously to a single distance, but rather usually ambiguously.

For the fine measurement, furthermore, the transmission signal can be emitted cyclically, for example per burst interval, with a phase offset relative to the—as described—synchronized receiver. Such an offset can be generated locally in the transmitter e.g. by means of a PLL or DLL unit in the transmitting unit, for example as a phase offset by in each case a specific part of the period of the transmission frequency. Per phase offset, therefore, the pulse shape is sampled by the receiver at a different location within the pulse, which brings about an increased resolution of the pulse shape (comparable with the time-stretched representation of periodic signals in the case of oscilloscopes with ETS sampling—although here the transmitter is shifted rather than the receiver). By means of the described separation of transmitter and receiver, the crosstalk can be kept small in this case despite the phase offset. The change in the phase offset can occur in each case at points in time at which no signals are emitted, that is to say for example between the active bursts. Possible transient or stabilization processes as a result of the phase offset therefore have no influence on the emitted signal, since they are virtually masked out by the transmission signal.

In other words, the distance measuring device carries out a coarse measurement of the distance with the aid of the propagation time between emission of a burst and reception of the burst, e.g. with the aid of an envelope curve of the burst, for example with a distance accuracy of greater than 10 cm. A fine measurement of the distance is furthermore effected, e.g. with the aid of a binary correlation of at least two signal waveforms of the modulation within the burst, for example with a distance accuracy of less than 10 cm, in particular less than 1 cm, for example approximately of 1 mm. In this case, the coarse and fine measurements for the purpose of ascertaining the distance are effected with the aid of the same burst-modulated signal, that is to say in the context of the same measurement. Specifically, an unambiguity of the distance ascertained by means of fine measurement can be determined here with the aid of the coarse measurement.

According to the present invention, coarse measurement and fine measurement can be carried out simultaneously. Firstly, in this case it is possible to use one or a plurality of burst packets—or else the envelope curve of the burst packets—as a whole for the coarse measurement (with an unambiguity dependent on the burst repetition frequency), while at the same time the higher-frequency modulation within one or a plurality of bursts can be used for the fine measurement with shorter unambiguity lengths but increased measurement accuracy. As a result, an accurate and unambiguous distance can be determined with one measurement. This allows faster measurements since, for determining unambiguity, it is not necessary to have recourse to the multi-frequency measurements with a plurality of transmission/mixing frequencies known in the prior art (see e.g.: WO 2006/063740) or similar principles. However, such principles can still be used, for instance for improving the robustness of the measurement.

Specifically, in this case, the burst packet can also be phase-shifted cyclically (for example in each case during the burst pauses) relative to the sampling frequency, as a result of which only synchronous signals and thus reduced crosstalk are present in the receiver, since phase-shifted signals occur only in the output stage of the transmitter for evaluation. This circuit part can be separated and optimized correspondingly well in terms of EMC engineering and can also be improved with regard to its EMC emission behavior according to the invention.

The construction of the transmitting unit according to the invention affords advantages with regard to interference emission, since, with the aid of said unit, at the same time the electrical leads to the light source that act as interference-emitting antennas can also be optimized, for example shortened, provided with a wider conductor cross section and/or shielded by so-called guard banding over wide sections.

BRIEF DESCRIPTION OF THE DRAWINGS

The method according to the invention and the device according to the invention are described in greater detail purely by way of example below with the aid of concrete exemplary embodiments illustrated schematically in the drawings, further advantages of the invention also being discussed. Specifically in the figures:

FIG. 1 shows a first embodiment of a distance measuring device according to the invention as a block diagram;

DETAILED DESCRIPTION

Figure 2A:
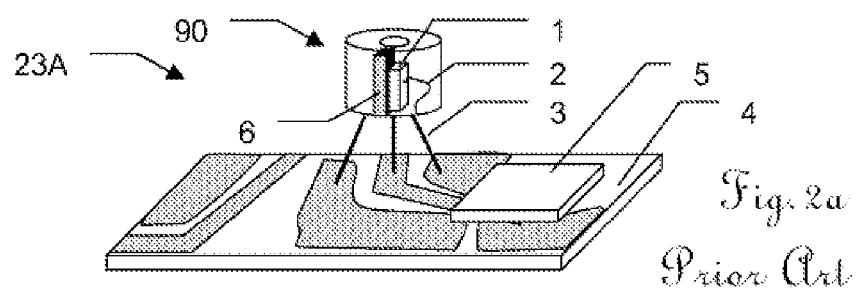
FIG. 2a shows an exemplary illustration of a known transmitting unit of an EDM.

The illustrations in the figures serve merely for illustrative purposes and should not be regarded as to scale.

FIG. 1 shows an embodiment of an optoelectronic distance measuring device 99 according to the invention as a block diagram. This can be, for example, a handheld, battery-operated distance measuring device or some other surveying instrument, such as are used for example diversely in the construction site sector. The lower half of the figure illustrates the two blocks—separated in accordance with a part of the invention—of the transmitting unit 23 and the receiving unit 22, which can be separated from one another in terms of EMI engineering by means of corresponding measures, for example by an EMI barrier. In this case, the separation illustrated should be regarded primarily in functional terms and can (but need not) be constructed in the form of two physically separated units. The target object 27 whose distance 28 is to be determined reflects at least part of the electromagnetic radiation 24 emitted by the transmitting unit 23 as a reception signal 25 back to the receiving unit 22. The upper half of the figure illustrates in each case a block diagram of an exemplary internal construction of an embodiment of the transmitting unit 23 and receiving unit 22. In this case, part of the emitted radiation can also be guided as a reference beam 26 via a reference path of known length to the receiving unit 22. In this case, a respective dedicated or else a common receiving unit 22 can be provided for the reference beam 26 and the measurement beam 25. In the case of a dedicated reference receiver, the receiving unit 22 or parts thereof (e.g. 10, 11, 12) should be embodied correspondingly doubly. A changeover between reference beam 26 and measurement beam 25 is also possible.

The transmitting unit 22 has a control processor 33 and a driver stage 5 for the emitting component 1. The emitting component 1 converts the electrical signals of the driver stage 5 into electromagnetic radiation 24 (e.g. a laser diode with stimulated emission). A PLL 34 is illustrated in the control processor 33, which PLL can alternatively also be arranged in the driver stage 5, but also externally. Moreover, control processor 33, driver stage 31 and PLL 34 can be integrated in a common chip. The supply filter 36 connects the transmitting unit 23 to the voltage supply 17. The supply filter 36 can—depending on the interference that occurs—be embodied by a simple backup capacitor through to complex LCR filter networks and, if appropriate, can also contain a voltage stabilization and/or regulation or a step-up or step-down converter.

The receiving unit 22 converts received electromagnetic radiation 25 into an electrical signal by means of the receiving element 10, said electrical signal being conditioned (for example amplified, filtered, subjected to heterodyne or homodyne mixing, etc.) for further processing in the conditioning unit illustrated as the block 11. The conditioning unit 11 can therefore be, for example, an input filter, an amplifier, a mixing stage, a sample&hold element, etc., or else a combination thereof. The receiver 10 of the optical radiation 25 can use as the receiving element a photodiode, for example an avalanche photodiode having a corresponding bias voltage. The—in accordance with the modulation of the emitted optical signal (and thus also of the received optical signal)—high-frequency electrical output signal of the photosensitive element 10 can be conditioned prior to further processing and conditioning 11, in particular by being subjected to impedance conversion, amplification and/or band limiting (for instance with an analog, active or passive filter, a transimpedance amplifier (TIA), . . . ). By way of example, such an amplifier stage can also be constructed, inter alia, with a circuit according to EP 2 183 865. As an alternative to a transimpedance condition at the output of the receiver 10, the input of the conditioning 11 can also be designed in such a way that the latter is adapted to the output characteristic of the receiving element 10. An example of one of the many possible signal filterings in the conditioning 11 is disclosed for instance in WO 2011/076907 or EP patent application No. 11187964.

The conditioned reception signal is digitized—that is to say quantified in terms of time and value—by an analog-to-digital converter 12 and fed to a digital computing unit 13 (a microprocessor, DSP, FPGA, ASIC, etc.) for further processing and determination of the distance. Furthermore, a PLL 14 together with an oscillator 15, for example a quartz oscillator, are connected. As usual in electronic circuit, here as well a filtering 16 (as already mentioned above) of the voltage supply 17 is illustrated, which can be positioned not only globally for the entire circuit, but also in a dedicated manner for individual components of the circuit.

The division of the EDM system 1 as shown in FIG. 1 can in particular also be utilized for avoiding or reducing crosstalk of the electrical signals, which contributes to an increased signal quality and thus to a more accurate or faster measurement. In this case, an improved suppression of crosstalk effects can be achieved by the implementation of a local separation of signals which are asynchronous or not in phase for the signal evaluation. Specifically, in direct sampling systems, a strictly synchronous receiver design can thus be achieved, for example. In the case of homodyne mixing, for example, the asynchronous signals that occur in this case are also often perpetrators of interference in the measurement signals.

In EDM designs, the transmitter 23, specifically the laser diode driver 5, is often one of the primary interference sources. In order to generate the short optical pulses having a high intensity which are required in a manner governed by the measurement principle, short current pulses having high peak values, steep edges and a correspondingly broad-edge frequency spectrum are required in the driving. Moreover, the modulation and emission frequencies, on account of the evaluation principle, are usually also in the same order-of-magnitude range as the evaluation frequency, which makes it more difficult or impossible for the interfering frequency range to be filtered out in a simple manner.

In order also to synchronize the transmitting circuit with the receiver, a clock signal output of the PLL 14 (or DLL 14) can also be led from the receiver 2 to the transmitter 3. Specifically, by transmitting a clock signal 37 synchronized by the receiver PLL 14 (instead of the asynchronous oscillator signal), it is possible to achieve a high synchronization accuracy, which also precludes an oscillator-PLL jitter. Since the transmitting unit 3 likewise has a PLL 34, it is sufficient, for the purpose of synchronization, to transmit a signal 37 of relatively low frequency (relative to the high evaluation clock rates), which affords advantages both with regard to the interference emission and with regard to the driver stages and power required for transmission. As a result of the signal direction from the receiver 2 to the transmitter 3 it is possible (specifically also on account of the impedance ratios of signal output to signal input) for crosstalk in the opposite direction to be kept small.

Besides the synchronization of the transmitter 3 relative to the receiver 2, these two circuit sections can have a communication connection 38 for controlling the sequences required for the measurement. In order to avoid crosstalk, such a communication can likewise take place in the same direction as the clock signal 37—that is to say unidirectionally from the interference-sensitive receiver 2 toward the transmitter 3, which is usually the perpetrator of interference. In this case, the communication 37 can likewise be effected synchronously with the transmitted clock signal 38, for example as a unidirectional, synchronous serial interface, as a result of which communication-dictated interference can additionally be avoided.

The separation of transmitter 3 and receiver 2 also allows each of the two separate circuit sections to be given a specifically tuned supply filter 16, 36, as a result of which crosstalk via the voltage supply 17 can also be prevented or at least reduced. Furthermore, corresponding EMI barriers 9 (e.g. in the form of EMI interference arresters, guard banding layouts, shields, metal cages, shielding metal foils or metal sheets, etc.) can also be fitted between transmitter 3 and receiver 2.

In this case, transmitter 3 and receiver 2 can be separated locally, for instance by the use of respectively dedicated chips (FPGAs, ASICs, . . . ). The latter can indeed be physically accommodated on a common printed circuit board given corresponding configuration separated technically in terms of layout. A construction of the EDM system 1 with two separate printed circuit boards (where printed circuit boards can also be taken to mean carrier substrates of circuits using thick-film or thin-film technology) allows, if appropriate, more flexibility in the instrument design (e.g. also for optical alignment of the emission direction of the emitter 30 of the transmitter 3 relative to the receiving element 10 of the receiver 20—or vice versa, and of the component arrangement within the instrument 1). A higher suppression of crosstalk can be achieved by means of the separation and a corresponding instrument design.

A driver stage 5—as it were the heart of the transmitting unit 23—besides a construction made from a plurality of discrete components, can also be completely or at least largely integrated into a semiconductor component, e.g. into an ASIC, by means of standard semiconductor processes. Besides the drive signal generation and also, if appropriate, the output stage (or at least parts thereof), as a consequence, further system components such as e.g. the PLL 34, the drive logic 33 or the processor 33 in the form of a digital computer, memory cells, etc., can also all be integrated in a common transmitter chip. The latter requires only a minimal number of external components for operation, a so-called 1-chip solution. One embodiment of an EDM according to the invention can thus be realized for example by two chips, for the transmitting unit 23 and the receiving unit 22, which, apart from the photoactive elements and diverse components that cannot be integrated, require hardly any external components. If appropriate, the system can also be supplemented by an external processor, microcontroller or DSP, which can perform especially evaluation or interfacing tasks. They can be accommodated as described on a common printed circuit board or two separate printed circuit boards 4, which are then electrically (and if appropriate also mechanically) connected to one another.

FIG. 2a illustrates one embodiment of a transmitting unit 23A of an EDM, that is to say of that part of the electronic circuit which has the task of generating and emitting optical pulses, such as are customary in the prior art. This transmitting unit need not necessarily be constructed as a separate unit, but can also be accommodated together with further circuit units on a printed circuit board 4. In other words, a logical unit can also be involved. Moreover, this transmitting unit 23 can indeed be distributed in terms of its geometrical arrangement; by way of example, the laser diode 90 and the associated driver circuit 5 can be fixed in each case separately to the housing or to separate housing parts and be interconnected only by electrical conductors 3, for example in order to enable an alignment for collimating the emitted light beam during the production of the EDM.

In this case, the known laser diode components 90 have a housing 7, in which a mount 6 for the actual light-emitting semiconductor substrate 1, that is to say the actual laser resonator, is situated. The external electrical connections 3 of the laser diode 90 are connected to the semiconductor substrate internally by means of bonding wires 2.

Figure 2B:
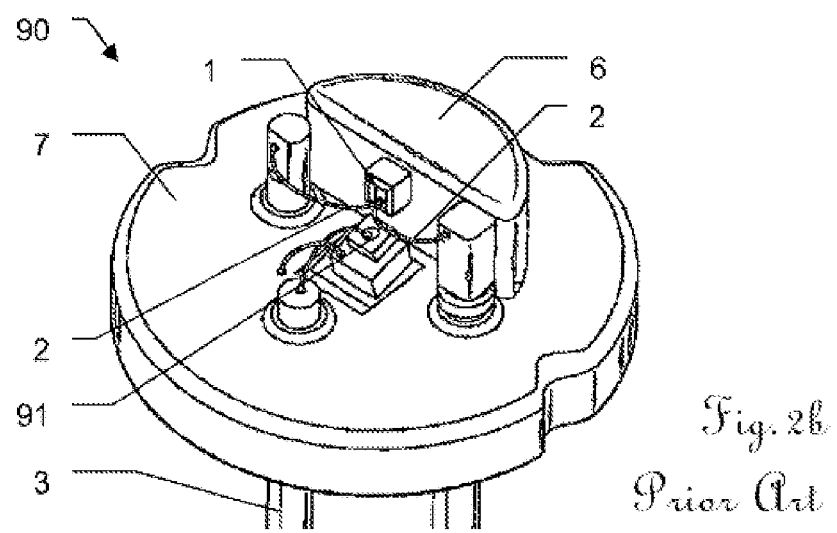
FIG. 2b shows an exemplary illustration of a known laser diode which is used in EDMs in the prior art.

FIG. 2b shows one known embodiment of a laser diode component 90 from the prior art without the upper part of the housing 7 in a close-up view. The actual semiconductor laser 1 mounted onto the carrier 6 is once again illustrated therein. In the example shown, on the intermediate part is also situated between the laser substrate 1 and the carrier 6, which intermediate part makes contact with the laser substrate 1 from the rear and connects it to a connection 3 by means of a bonding wire 2, but electrically insulates this contact from the carrier 6 and from the housing 7. The front side of the laser substrate 1 is directly contact-connected with a bonding wire 2 leading to a second connection 3. A monitor photodiode 91 is furthermore shown, which can be used for regulating the output power of the laser driver 5, in particular in order to be able to ensure compliance with the laser safety guidelines or else to be able to compensate for the temperature-dependent emission behavior of the semiconductor laser. For this purpose, part of the emitted laser light is coupled out to said monitor diode; this often takes place by means of a small coupling-out at the inwardly directed end of the resonator.

Figure 3:
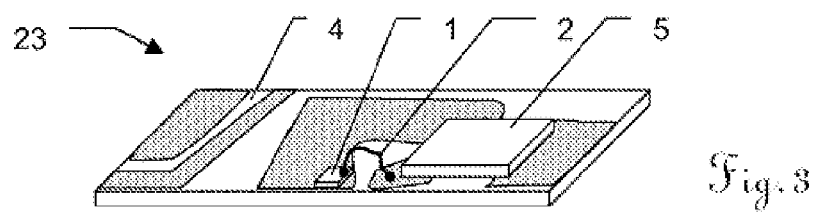
FIG. 3 shows an exemplary, schematic illustration for elucidating the principle of an EDM transmitting unit according to the invention.

FIG. 3 schematically shows one embodiment of a transmitting unit 23 according to the invention of an EDM 99, wherein the light-emitting semiconductor 1 is applied without a housing 7 on the printed circuit board 4. In this case, the laser driver 5 is connected to the semiconductor 1, for example by means of a bonding wire 2. Besides wire bonding, in this technological field other methods are also known such as friction bonding, for instance, which can likewise be used according to the invention, for example for applying the semiconductor substrate 1 to the printed circuit board 4. According to the invention, an improvement of an EDM, specifically a transmitting unit 23 of an EDM, is achieved by such a construction. Specifically, the lead inductance to the semiconductor laser 1 can be reduced by the arrangement according to the invention. This affords advantages for an emission of high-frequency laser pulses, since, with a low inductance, the impression of short and high current pulses can be realized more simply, as a result of which for example the laser driver 5 can be fashioned more simply. When a bonding wire 2 is mentioned here, this also encompasses a plurality of parallel bonding wires 2 in order for example to obtain a larger lead cross section and thus also a lower lead impedance or in order to achieve a uniform current distribution by multiple contact-connection of the semiconductor 1.

Moreover, a more compact design can be achieved with the aid of the concept according to the invention. This can be useful not just for miniaturizing the structural size of the EDM. The concept according to the invention can also be used for advantageously reducing the electromagnetic interference emission of the fast pulse or burst modulation in an EDM by virtue of the fact that electromagnetic crosstalk from the transmitter part to the receiver part can be reduced. The short electrical pulses having steep signal edges, as a result of a contact-connection according to the invention between laser driver 5 and semiconductor laser substrate 1, also emit correspondingly fewer electromagnetic waves, not least owing to the signal paths shortened according to the invention, which act as antennas.

The principle according to the invention is suitable in particular in the case of an EDM equipped with a laser driver without a monitor diode, for example such as is described in the reference cited above. However, in the embodiment according to the invention, too, a monitor photodiode can be mounted onto the printed circuit board, to which part of the emitted laser radiation is coupled out and which can be used for monitoring the emitted output power. Alternatively, in an EDM having an internal reference section, it is also possible to use a photodiode for receiving this reference light, in order to monitor the output power, since after all the proportion of light coupled out via the reference path is known and constant over the lifetime of the instrument. Consequently, a receiver for a proportion of light guided via an instrument-internal reference path can be used as a monitor diode for monitoring the laser safety. This can also be regarded as an independent invention which can also be applied independently of the semiconductor arrangement according to the invention, that is to say for example also in association with laser diodes, laser diode applications and driver circuits from the prior art. In particular, this can also be regarded as a development of the laser driver without a monitor diode as referenced further above, for example as an additional monitoring entity, for instance also in order to be able to achieve a higher safety class.

The exemplary embodiment illustrated schematically in FIG. 3 serves for elucidating the basic construction principle according to the invention and the functioning of an EDM transmitting unit according to the invention. Some of the specific embodiments encompassed according to the invention are explained in further detail with reference to the following figures, wherein the configurations shown here should not be regarded as an exhaustive enumeration.

Figure 4A:
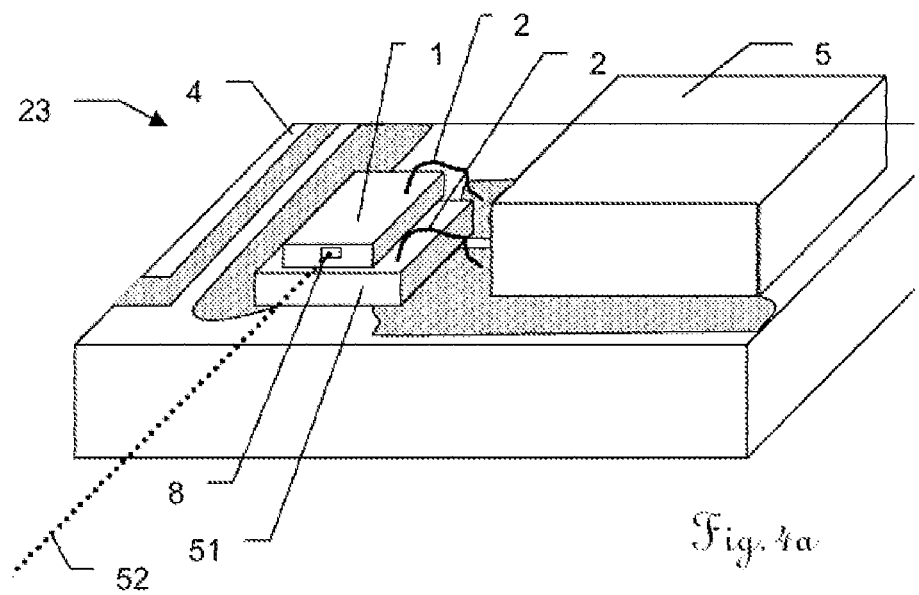
FIG. 4a shows an exemplary first embodiment of a transmitting unit according to the invention of an EDM.

FIG. 4a illustrates one exemplary embodiment of a construction according to the invention of an EDM transmitting unit. The printed circuit board 4 in the sense of the present invention can be for example an FR1 to FR4, CEM1, CEM3, Teflon, silicon or ceramic printed circuit board having a monolayer, multilayer or HDI construction. To put it another way, printed circuit board 4 should be understood generally to mean a nonconductive carrier material having structures composed of electrically conductive conductor tracks for connecting electronic components and producing electrical networks and for mechanically fixing components.

According to the invention, a semiconductor laser substrate 1 and a laser driver 5 or at least the power stage of the laser driver 5 (e.g. the power switching transistor of the laser driver 5) are applied on said printed circuit board 4. In this case, the semiconductor laser 1 is applied as a laser substrate or laser die without a housing, that is to say only as the semiconductor substrate which forms the semiconductor laser structure, which semiconductor substrate is correspondingly reflectively coated at both ends in order to form a laser resonator and on one side has an exit window 8 for the stimulated emission of laser light 52. The semiconductor laser 1 is embodied as a so-called edge emitting laser diode. The latter can be embodied as a cube-shaped semiconductor substrate, having P- and N-doped semiconductor layers, between which the light amplification process takes place in a so-called cleavage plane. In this case, the stimulated emission of light takes place at the side faces (usually the smallest side face of the cube—therefore the term "edge emitting"), which are embodied as optical mirrors and form the laser resonator from which the laser beam is coupled out on at least one side. On account of the layered P-N construction, contact is made with the semiconductor materials (in the standard or basic variant, that is to say without further structural measures) from opposite sides or faces.

According to the invention, therefore, the housing 7 present in the prior art is omitted. In the first embodiment illustrated here, in this case the semiconductor laser 1 is applied to the printed circuit board 4 by means of an electrically insulating intermediate element 51. In this embodiment, the intermediate element 51 is associated with electrically contact-connecting the underside of the semiconductor laser 1, dissipating heat toward the printed circuit board 4, and elevating the semiconductor laser 1, in order that—on account of the beam divergence of the emitted laser light 52 (of typically approximately 5 to 30°, depending on embodiment and divergence axis)—partial shading of the light beam by the printed circuit board 4 does not occur. Since in particular the edges of printed circuit boards are subject to very coarse dimensional tolerances, such an elevated positioning can be advantageous, especially in comparison with the positioning accuracies of the components on the printed circuit board 1, which are of an order of magnitude of approximately 30 μm, for example, and is usually significantly more accurate than the often scribed, stamped or coarsely milled printed circuit board edges.

In order that the lead inductance to the semiconductor laser 1 is kept low according to the invention, said laser is contact-connected onto the conductor tracks of the printed circuit board 4 on a short path by means of bonding wires 2. In terms of manufacturing technology this is referred to as chip-on-board technology (COB), also designated as "bare chip mounting" by German speakers. In this case, the embodiment shown contact-connects the top side of the semiconductor 1 directly with a bonding wire 2; the underside, by means of a conductive layer on the intermediate element 51—on which the semiconductor 1 is conductively mounted by its lower contact area —, is likewise connected onto the printed circuit board 4 by means of a bonding wire. The laser driver 5 is also situated on the printed circuit board 4, which laser driver is illustrated here as a monolithic component, but as described can also be constructed from a plurality of discrete and/or integrated components. In order not to forfeit the low connection inductance achieved according to the invention, in this case at least the power stage or output stage of the laser driver 5, which stage is also situated on the same printed circuit board 4 as the semiconductor laser 1, should be linked with short line lengths. Alternatively, the intermediate element 51 can also be conductive, as a result of which the underside of the semiconductor laser 1 can be contact-connected onto the printed circuit board 4 by means of said intermediate element. If the laser driver 5 or the output stage thereof is likewise embodied using bare chip mounting, it is also possible to produce a direct bonding wire connection between the light-emitting semiconductor and the driving semiconductor.

As a result of the mounting according to the invention on the printed circuit board 4, a good dissipation of heat from the semiconductor 1 can also be achieved. Especially in the case of mounting on a correspondingly large-area and thick outer copper layer, a good dissipation of heat can be achieved, which can also be improved for example by additional application of heat sinks (e.g. by soldering onto the copper area), multiple through-plating to further printed circuit board layers (e.g. a planar ground plane on the underside), etc. By way of example, a shielding plate or shielding housing soldered on for reducing the emitted electromagnetic interference can also function as a heat sink.

Figure 5A:
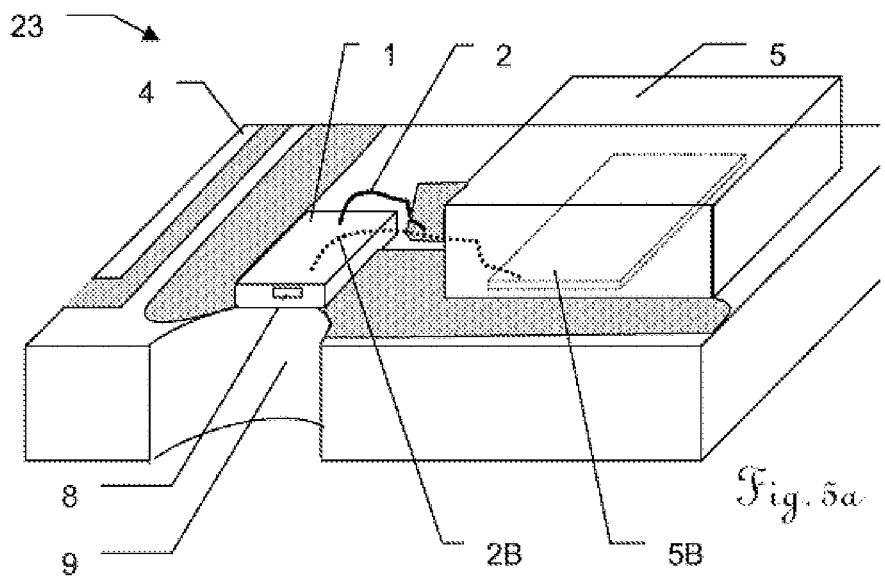
FIG. 5 shows an exemplary second embodiment of a transmitting unit according to the invention of an EDM.

A second exemplary embodiment of the principle according to the invention is illustrated here with reference to FIG. 5*a*. The semiconductor laser 1 therein is directly fitted on the printed circuit board 4, for example soldered or, by means of conductive plastic or adhesive, mechanically and electrically connected to a first conductor track of the printed circuit board 1. The second, upper connection of the semiconductor is in this case connected onto a second conductor track of the printed circuit board 4 by means of a bonding wire 2. The bonding connection 2B—illustrated in a dotted manner—from the laser substrate 1 to the output stage semiconductor 5B of the laser driver 5 is a further alternative embodiment according to the invention. Such COB bonding connections are often potted for protection against mechanical and/or chemical damage, e.g. using epoxy resin or the like.

Figure 5B:
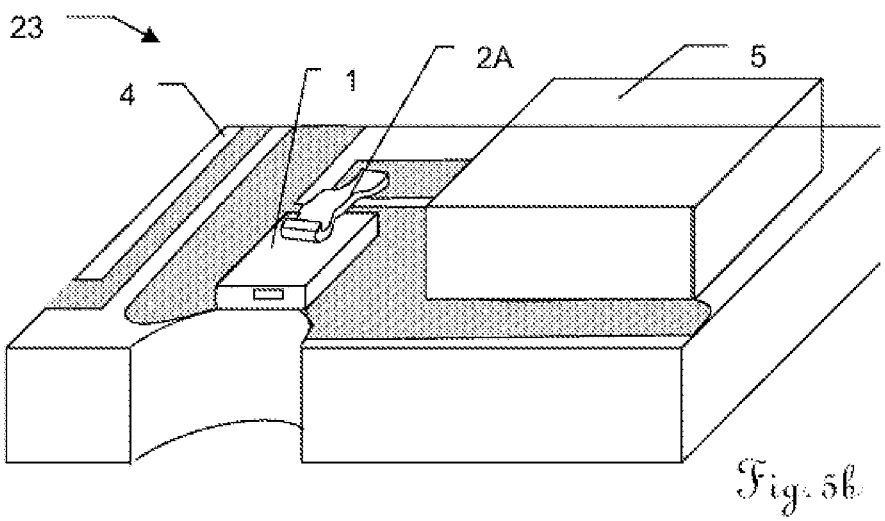

Alternatively, as illustrated in FIG. 5*b*, the top side of the semiconductor 1 can for example also be contact-connected by means of a contact strip which is fixed on the printed circuit board 1 and e.g. presses springs from above onto the semiconductor 1 and/or is contact-connected on the top side of the semiconductor 1 e.g. likewise by adhesive bonding or soldering. In this case, mechanical guides which ensure an exact positioning of the semiconductor 1 can also be fashioned.

Both the variant from FIG. 5*a* and that from FIG. 5*b* are embodiments according to the invention of a direct mounting of the semiconductor element 1. In order that the lead inductance to the semiconductor laser 1 is kept low, said semiconductor laser is directly connected to the printed circuit board by one of the contact areas and the other contact area is directly contact-connected onto the conductor tracks of the printed circuit board 4 e.g. by means of bonding wires 2 or contact strips 2A.

In the context of the terms customary in chip-on-board technology, a distinction can be made here between different variants. By way of example, the so-called chip&wire variant can be employed, in which the semiconductor is contact-connected from above (that is to say from the side facing away from the printed circuit board), as illustrated in FIG. 4*a*.

Alternatively, the so-called flip-chip technique also exists, in which the contacts of the semiconductor 1 face the printed circuit board 4 and are electrically and mechanically connected by means of solder balls or conductive plastic, for example. Since the standard semiconductor lasers (in a manner governed, inter alia, by the layered construction of their semiconductor structures) usually have to be contact-connected on opposite surfaces (e.g. from above and from below), unfortunately they are not accessible per se to flip-chip mounting, and so, as described, at least a single bonding wire 2 or contact strip 2A is required. This can indeed be remedied by a corresponding design of the semiconductor structures for transferring both connections to one side. However, the number of items to be produced before such a modification is worth implementing is generally very high, especially in comparison with the standard components.

In order to enable flip-chip mounting, as a further embodiment according to the invention, in the case of a standard semiconductor laser substrate, the lower semiconductor layer 42 can be removed, e.g. etched away or mechanically eroded, at one location or on one side, such that there the opposite, upper semiconductor layer 41 can likewise be contact-connected from below e.g. by means of a ball 43 or the like. The exposed lower semiconductor layer can for example also be contact-connected with a second bonding wire 2, such that, besides the abovementioned contact-connection by means of connections downward to the printed circuit board 4 or the laser driver 5, mounting with the connections upward and bonding of said connections to the printed circuit board 4 or the laser driver 5 can also be implemented. In this case, an electrically conductive contact-connection of the underside of the semiconductor laser 1 can be obviated, which opens up further mounting possibilities.

Figure 4B:
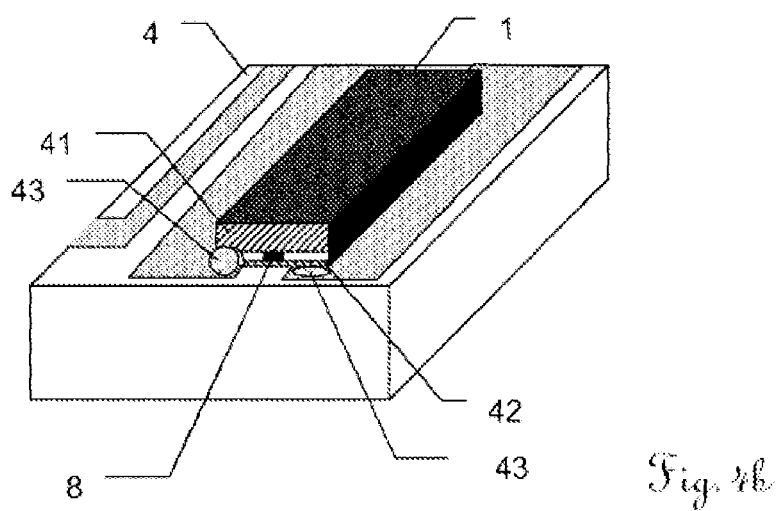
FIG. 4b shows an exemplary embodiment of a semiconductor laser for flip-chip mounting on an EDM transmitting unit according to the invention.

One exemplary embodiment of flip-chip mounting is illustrated in FIG. 4*b*. Since the semiconductor layer 42 to be removed is usually very thin (e.g. in the range of approximately 3-5 μm), such a modification can be carried out very easily on standard semiconductors 1 that have already been produced. In this case, the flip-chip mounting can be effected directly onto the printed circuit board 4 or else piggyback onto the laser driver chip 5. In this case, the piggyback mounting can be prefabricated in the semiconductor factory as an assembly which can then be mounted as COB onto the printed circuit board 4 and can be connected to the printed circuit board e.g. by means of bonding wires. A potting of the assembly into a housing (e.g. with pin or ball connection) can likewise be carried out, provided that a window for the light exit is provided. With a the above-described direct electrical linking of the semiconductor laser, a very low connection impedance can be obtained. On account of the small distance between the light exit window 8 and the mounting area, it is necessary, if appropriate, to take account of possible partial shading of the divergent light beam with the choice of the mounting position, for example by means of an emission window projecting relative to the underlying component, or other structural measures.

In order to avoid shading by the printed circuit board 4, without also demanding high dimensional tolerances of the printed circuit board edge, the light-emitting semiconductor 1 is positioned at a hole 9 drilled during printed circuit board production—or to put it more precisely at the circumference of part of a hole 9. These holes 9 can be produced with high dimensional tolerances in the standard process of printed circuit board production and therefore do not require costly additional manufacturing steps. The tolerances of the printed circuit board edges can therefore be kept coarse, since during the production of the edge it is merely necessary to achieve division—that is to say for example approximate halving—of the hole. This can e.g. already be achieved in the case of a hole diameter of the order of magnitude of more than double the dimensional tolerance of the edge (for example triple or quadruple or even more). Since the component positioning is effected (or has to be effected) relative to the holes anyway during printed circuit board population, it is possible, without any problems, to achieve a positional accuracy of the semiconductor laser 1 with respect to the hole 9 of less than 100 μm, usually even lower than that, for instance about 30 μm or less. A further advantage of the applying according to the invention at the edge of such a hole 9, as shown in this embodiment, is also that the light source can be applied in a manner set back relative to the edge, rather than in an exposed manner, which also affords protection against mechanical damage, in particular during the manufacture and assembling of the EDM.

Figure 6:
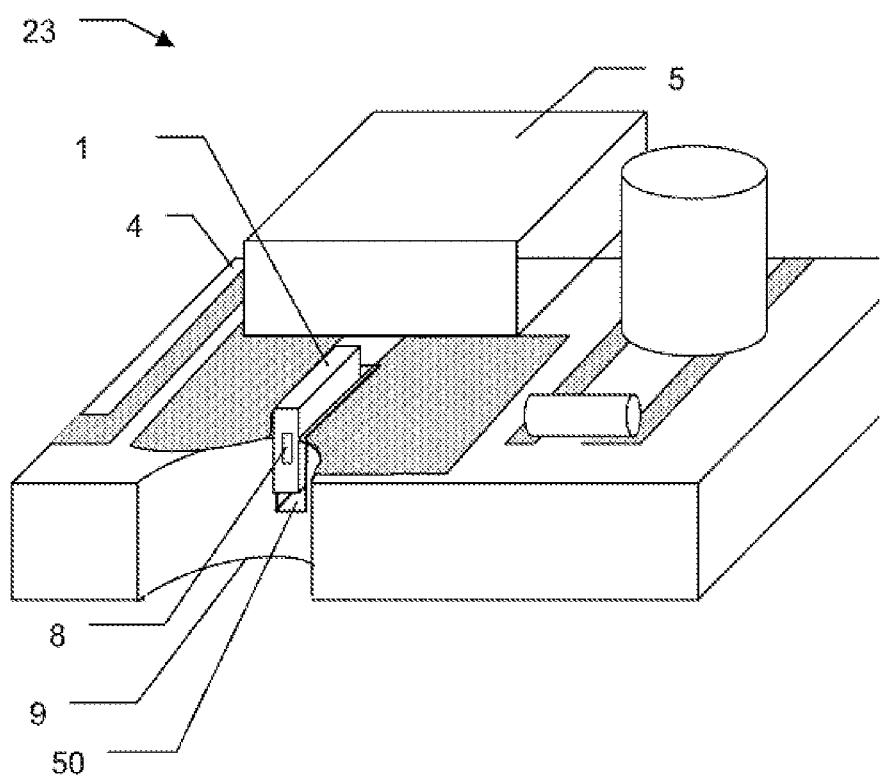
FIG. 6 shows an exemplary third embodiment of a transmitting unit according to the invention of an EDM.

FIG. 6 illustrates an embodiment in which the abovementioned, often customary connection occupation on opposite areas of the semiconductor substrate and the requisite contact-connection from two sides is achieved by edgewise mounting. In the exemplary embodiment shown, in this case the semiconductor is introduced into a slot 50 into the printed circuit board surface and is contact-connected by a respective conductor track laterally (or from above and below from the point of view of the semiconductor now rotated by) 90°, for example by soldering or conductive adhesive bonding. In this case, the slot 50 can be a notch which is continuous or non-continuous with regard to the printed circuit board thickness, e.g. produced by milling, drilling of an overlapping series of holes, sawing, laser cutting, laser engraving, etc. In principle, such upright application of the semiconductor 1 is also possible without such a notch 50, directly onto the printed circuit board surface, but can prove to be difficult in standard manufacturing processes. The notch 50 can also be realized as a gap or spacing between two conductor tracks of the printed circuit board which can accommodate the semiconductor substrate. Particularly in the case of a correspondingly high layer thickness of the conductor track material of the topmost layer (of e.g. 70 or 100 μm), the semiconductor 1 can be introduced edgewise into the interspace and can be contact-connected in each case laterally by the conductor tracks.

Figures 7A, 7B:
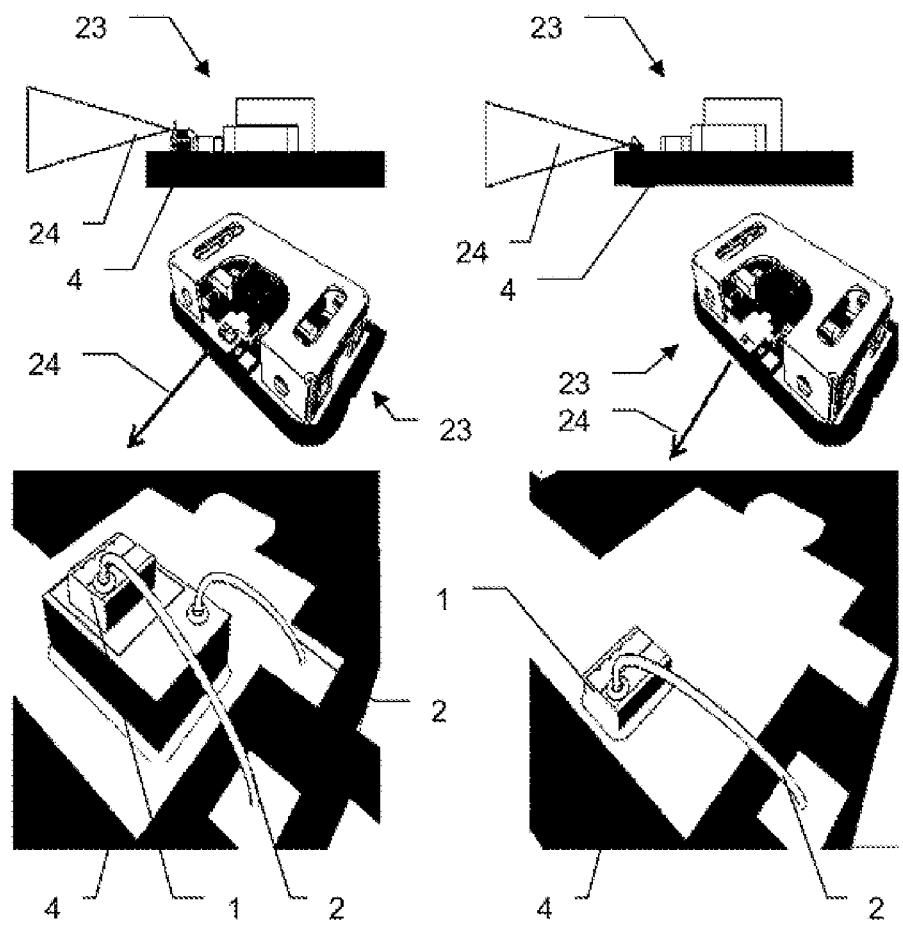
FIG. 7a shows an exemplary fourth embodiment of a transmitting unit according to the invention of an EDM.
FIG. 7b shows an exemplary fifth embodiment of a transmitting unit according to the invention of an EDM.

FIG. 7a and FIG. 7b show two further specific embodiments of a transmitting unit 23 according to the invention of an EDM, in each case in a side view, an axonometric representation of the entire transmitting unit 23, and a detail view of the applying according to the invention of the optical transmitting element 1. In this case, the semiconductor 1 can be applied by means of conductive epoxy, and the upper P-side of the semiconductor 1 can be contact-connected onto the printed circuit board 4 by means of a bonding wire 2. An intermediate element 51 is additionally illustrated in FIG. 7a.

Figure 8:
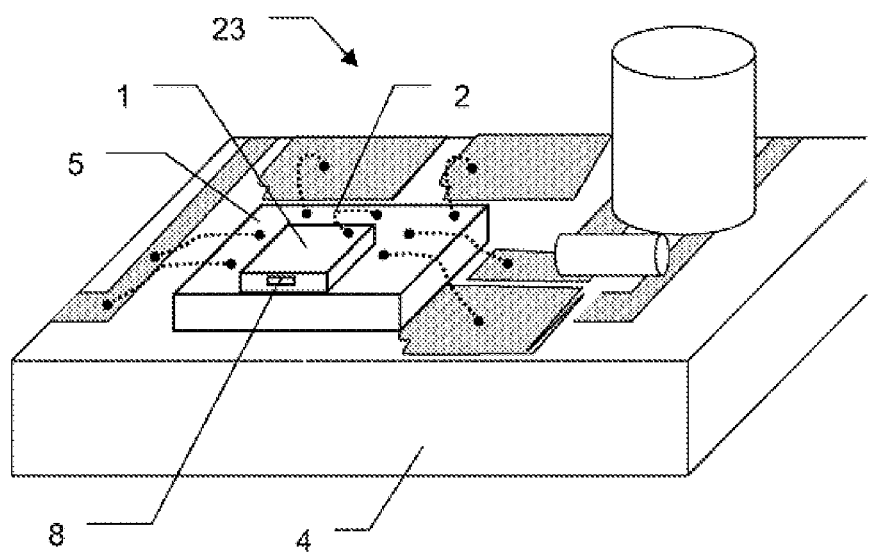
FIG. 8 shows an exemplary sixth embodiment of a transmitting unit according to the invention of an EDM.

FIG. 8 shows an embodiment which shows chip-on-chip mounting of the semiconductor laser 1 on the laser driver 5 (or the output stage thereof). In this case, the laser driver 5 is mounted as a bare chip onto the printed circuit board 4 and is electrically connected thereto by means of bonding wires 2. On the side facing the laser driver 5, the laser semiconductor 1 is directly conductively connected to the laser driver 5, and the second electrical connection is produced from above by means of a bonding wire 2 from the laser 1 to the driver 5. Alternatively, above-described flip-chip mounting of the laser semiconductor 1 can also be employed; in particular, in this case the two semiconductors can already be mounted as a prefabricated common assembly onto the printed circuit board 4.

Figure 9A:
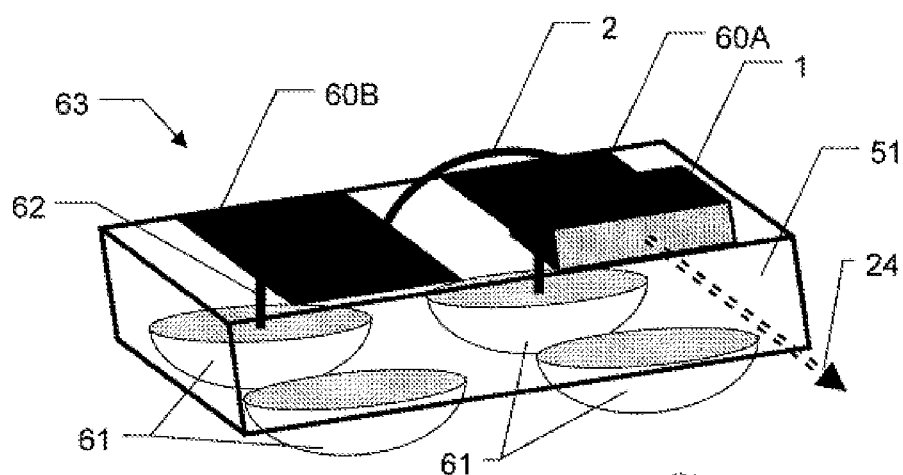
FIG. 9a and FIG. 9b show an exemplary seventh embodiment of a transmitting unit according to the invention of an EDM.
Figure 9B:
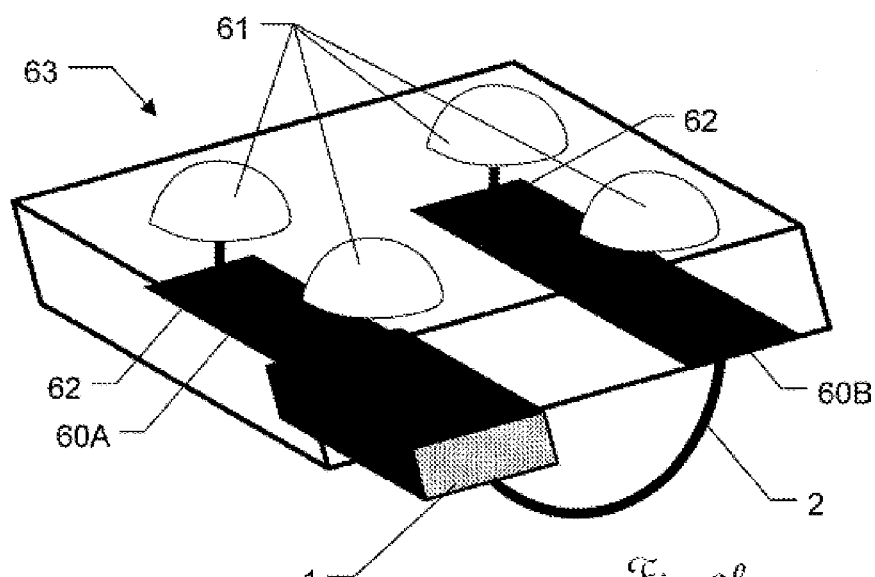

FIG. 9a and FIG. 9b show an embodiment of a transmitting unit 23 according to the invention of an EDM in which only the laser substrate 1 with an intermediate element 51 similar to FIG. 4a is illustrated. The upper view in FIG. 9a is rotated by 180° relative to the lower view in FIG. 9b and the intermediate element 51 is illustrated as transparent in order to be able to detect both sides. The contact-connection of the semiconductor laser 1 is effected here—in accordance with the planar semiconductor layer construction often used—from two opposite sides by virtue of one side being conductively connected to a first conductive area 60A on the electrically insulating intermediate element 51. The second side of the semiconductor laser 1 is connected onto a second conductive area 60B on the intermediate element 51 by means of a bonding wire 2.

The conductive areas 60A, 60B are contact-connected onto the opposite side of the intermediate element 51, by means of plated-through holes 62 through the intermediate element 51 in the embodiment shown. The intermediate element 51 therefore has plated-through holes between at least one connection area of the semiconductor laser 1 and at least one of the connections 61 to the printed circuit board 4. On the opposite side of the intermediate element 51 relative to the semiconductor laser 1, there are situated solder beads 61 in the form of BGA contacts (or alternatively with QFN or MLF pins) by means of which the intermediate element 51 with the semiconductor laser 1 as a prefabricated component 63 is mounted and contact-connected in the context of SMD mounting onto the printed circuit board 4 with the laser driver 5. To put it another way, the intermediate element 51 with the laser diode is embodied as an electronic component 66 in the form of a surface mountable device (SMD) with ball grid array (BGA) contact-connections 61 as connections to the printed circuit board 4.

In order to protect the sensitive bonding wire 2 against mechanical damage, it can be potted with a nonconductive material (e.g. with epoxy or the like) or covered with a protective cap.

Figure 10A:
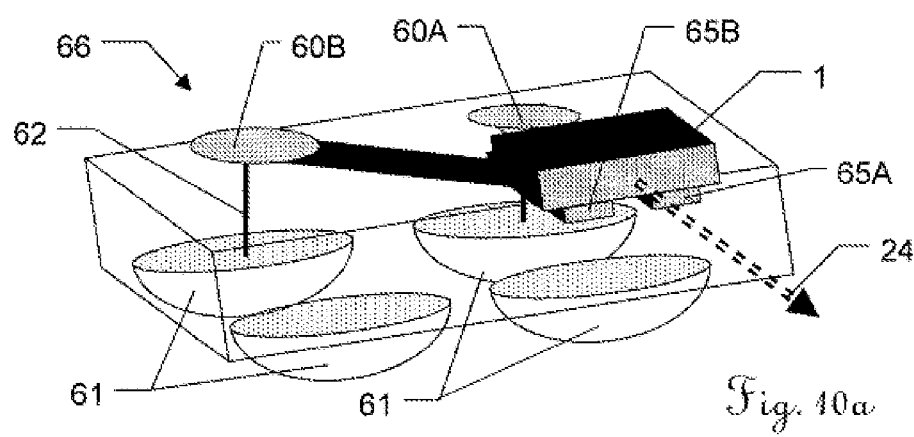
FIG. 10a and FIG. 10b show an exemplary eighth embodiment of a transmitting unit according to the invention of an EDM.
Figure 10B:
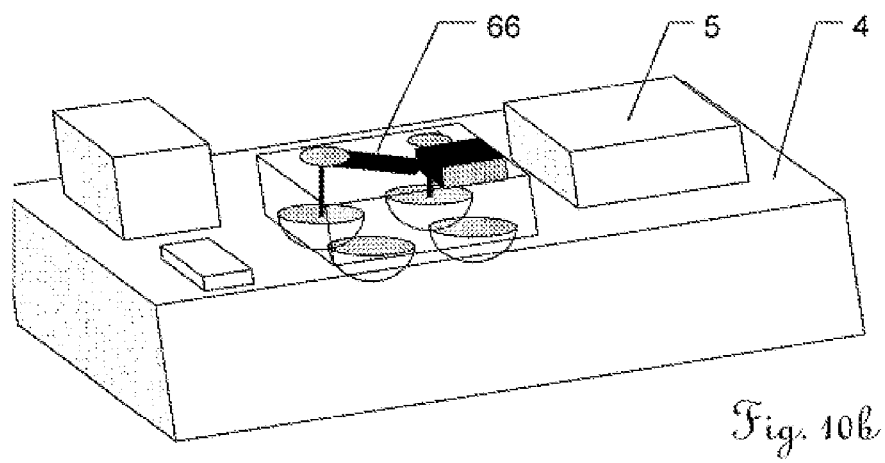

FIG. 10a and FIG. 10b show another embodiment of a transmitting unit 23 according to the invention of an EDM, in which only the laser substrate 1 is fitted on the intermediate element 51 using flip-chip mounting, that is to say with the two connections of the semiconductor laser 1 that are to be contact-connected toward the intermediate element 51. Below the semiconductor laser, the electrically nonconductive intermediate element 51 is equipped with conductive contact areas for contact-connecting the connections, which are contact-connected through to the opposite side relative to the laser substrate by means of the vias 62. For connection or for mounting on the printed circuit board 4 by means of an SMD automatic mounting machine, the component 66 formed in this case with semiconductor laser 1 and intermediate element 51 has ball contacts 61 on the underside. To put it another way, the intermediate element 51 with the laser diode is embodied as an electronic component 67 in the form of a surface mountable device (SMD) with ball grid array (BGA) contact-connections 61 as connections to the printed circuit board 4.

FIG. 10b shows an excerpt from a printed circuit board 4 of a transmitting unit 23 with the mounted component 66. The prefabricated SMD component 66 that arises in this case can therefore be mounted on a printed circuit board 4 of the transmitting unit 23 of the distance measuring device 99 in a standard mounting method. In order to protect the semiconductor laser 1 against mechanical damage, said laser can be potted on the intermediate element 51 or covered with a protective cap.

Figure 11A:
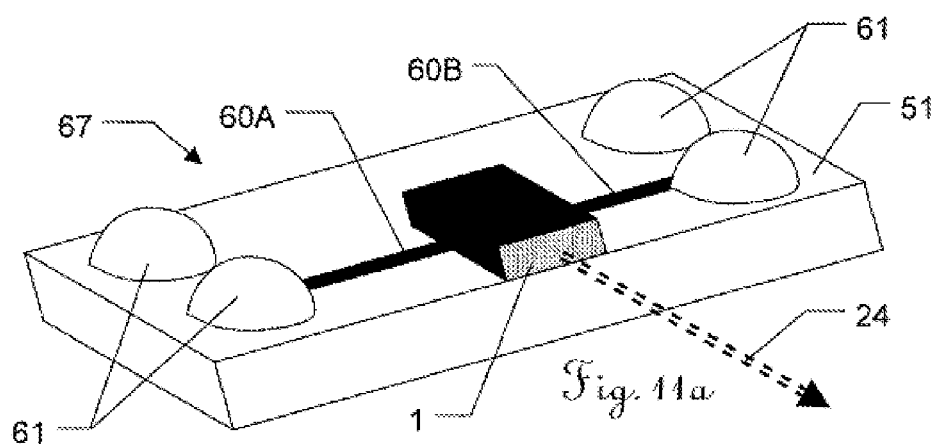
FIG. 11a, FIG. 11b and FIG. 11c show an exemplary ninth embodiment of a transmitting unit according to the invention of an EDM.
Figure 11B:
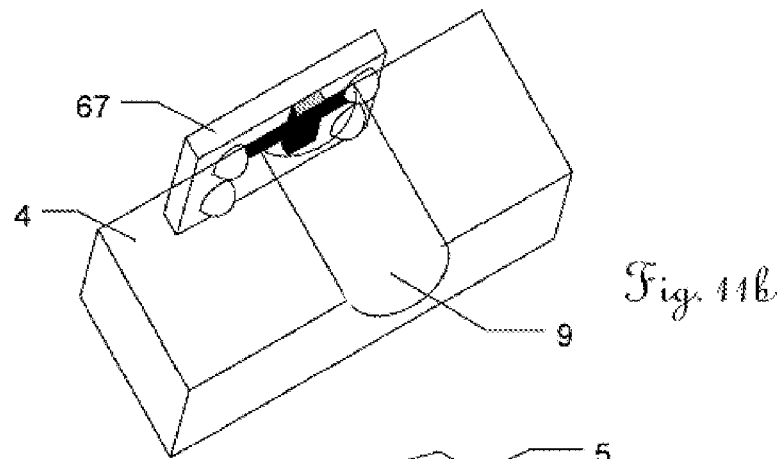
Figure 11C:
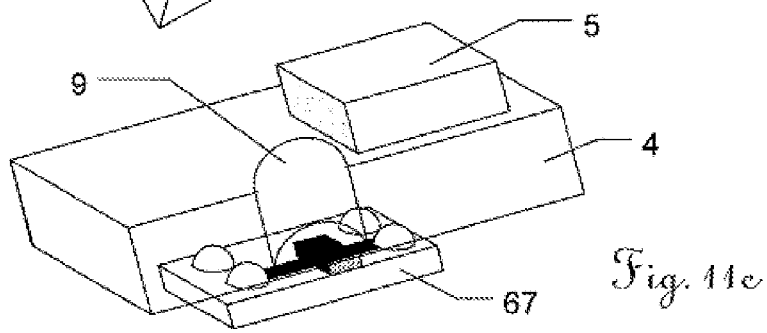

FIG. 11a, FIG. 11b and FIG. 11c show a further embodiment of a transmitting unit 23 according to the invention of an EDM, in which the semiconductor laser 1 is fitted as laser substrate on the intermediate element 51 using flip-chip mounting. In this variant, the ball contacts 61 are situated on the same side as the semiconductor laser 1 and are connected to the connections of the laser substrate 1 by means of the conductive areas 61A, 60B on the intermediate element 51 (e.g. embodied in the form of metalized areas, etc.). The SMD component 67 according to the invention that arises in this case, as illustrated in both lower subfigures FIG. 11b and FIG. 11c, is mounted on the printed circuit board 4 of the transmitting unit 23 of the distance measuring device 99 together with the other components such as, for instance, the laser diode driver 5 on the production line and is soldered e.g. in a reflow furnace.

The semiconductor laser 1 is therefore applied on the same side of the intermediate element 51 as the BGA contact-connections 61, which side is mounted as the underside facing toward the printed circuit board 4. In this case, the semiconductor laser 1 can become located in a cutout formed at the edge of the printed circuit boards 4 (e.g. in the above-described hole divided by the printed circuit board edge) in order to be mechanically protected and not impeded in terms of its light emission 24.

Figure 12:
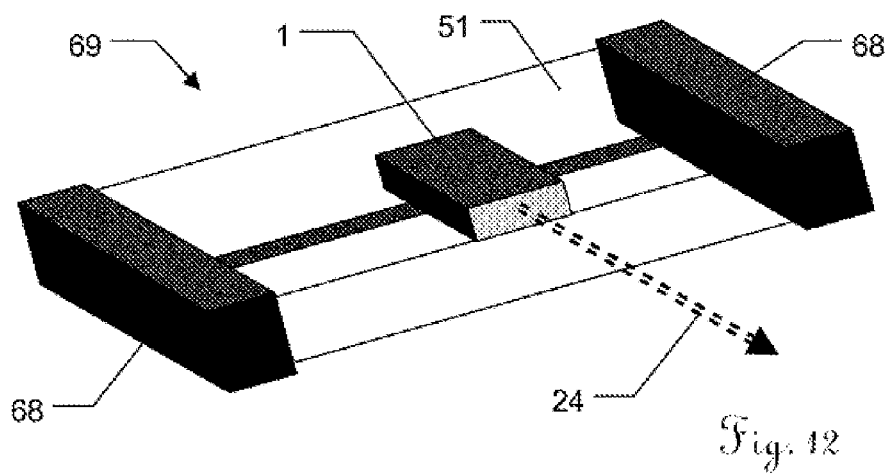
FIG. 12 shows an exemplary tenth embodiment of a transmitting unit according to the invention of an EDM.

FIG. 12 shows a further embodiment of a transmitting unit 23 according to the invention of an EDM, in which the semiconductor laser 1 is fitted as laser substrate on the intermediate element 51, which has a design from one of the SMD component series 2512, 2010, 1218, 1210, 1206, 0805, 0603, 0402, 0201 or 01005 and has soldering contacts 68 at the longitudinal ends. The intermediate element 51 with the laser diode is therefore embodied as an electronic component 69 in the form of a surface mountable device (SMD) with contact pads 68 fitted at the longitudinal ends as connections to the printed circuit board 4.

In all of the embodiments mentioned above, the electrically nonconductive, that is to say insulating, intermediate element 51 can e.g. consist of silicon, silicon carbide or ceramic and be provided with metalized contact-connections.

Figure 13:
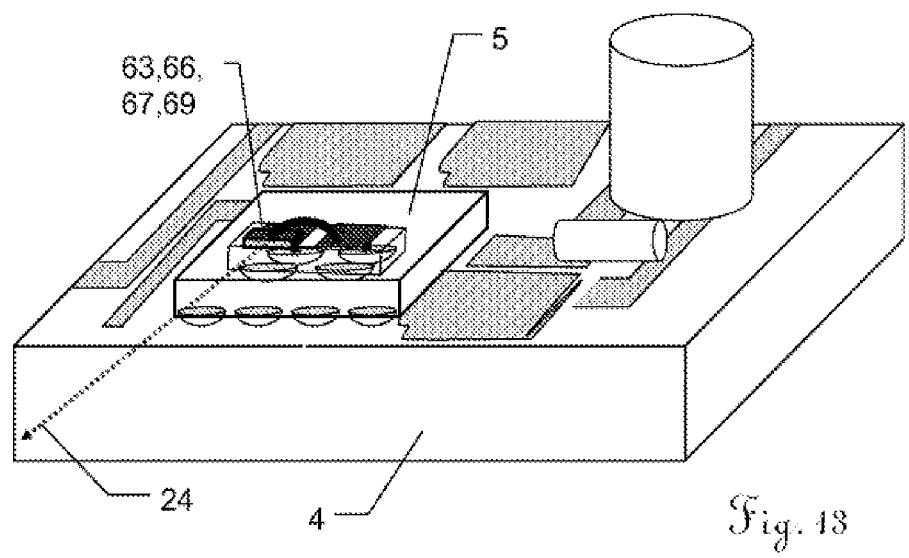
FIG. 13 shows an exemplary eleventh embodiment of a transmitting unit according to the invention of an EDM.

FIG. 13 shows a further embodiment according to the invention of a transmitting unit 23 of an EDM 99, in which the intermediate element 51 with the semiconductor laser 1 is fitted as a prefabricated component 63, 66, 67, 69, for example as illustrated in FIG. 9, FIG. 10, FIG. 11 or FIG. 12, directly on the laser diode driver 5 using package-on-package mounting. By virtue of the connections thus kept short between laser driver output and semiconductor laser, the lead impedance can be kept low and the distance measuring device can emit short measurement light pulses of high intensity in an energy-efficient manner.

In a manner that is obvious to the person skilled in the art, it is also possible to realize further embodiments with a construction according to the invention of the transmitting unit 23 which can be adapted or optimized in terms of engineering in accordance with the requirements of the specific distance measuring device.

What is claimed is:

1. An optoelectronic distance measuring device comprising:
    a transmitting unit comprising a printed circuit board, a semiconductor laser and a laser diode driver, for emitting high-frequency intensity-modulated optical radiation,
    a receiving unit for receiving a portion of the optical radiation, said portion being reflected from a target object, using a photosensitive electrical component with an electrical output signal as reception signal,
    a conditioning unit for conditioning the reception signal comprising an amplifier and a filter,
    an analog-to-digital converter for digitizing the conditioned reception signal, and
    an electronic evaluation unit, which ascertains a distance from the distance measuring device to the target object on the basis of a signal propagation time with the aid of the digitized reception signal, and
    wherein the semiconductor laser is applied as a laser substrate without a housing to the printed circuit board.

2. The distance measuring device as claimed in claim 1, wherein the laser substrate is positioned at the edge of a hole divided by a printed circuit board edge.

3. The distance measuring device as claimed in claim 1, wherein in the laser substrate a first semiconductor layer as first connection is removed in a partial region of said layer, such that a part of the opposite second semiconductor layer as a second connection is exposed and contact-connectable, such that the laser substrate is contact-connectable from the side of the first semiconductor layer at the first connection and the second connection.

4. The distance measuring device as claimed in claim 1, wherein the laser substrate, as first connection, is coupled electrically conductively onto the printed circuit board.

5. The distance measuring device as claimed in claim 1, wherein the laser substrate, as a second connection, is contact-connected onto the printed circuit board using a bonding wire.

6. The distance measuring device as claimed in claim 1, wherein the laser substrate, as second connection, is contact-connected onto the printed circuit board using an electrically conductive contact strip.

7. The distance measuring device as claimed in claim 1, wherein the laser substrate is introduced into a slot between two conductor tracks of the printed circuit board and is lateral in each case to the conductor tracks.

8. The distance measuring device as claimed in claim 1, wherein the printed circuit board is configured for dissipating waste heat of the laser substrate, with conductor track areas, vias for dissipation into lower conductor track layers and/or using a heat sink fitted on the printed circuit board.

9. The distance measuring device as claimed in claim 1, wherein at least one part of the laser diode driver is arranged with the laser substrate on the same printed circuit board, the laser substrate is contact-connected in such a way that with a shortened lead length from the laser diode driver to an electrical connection of the laser substrate the lead impedance thereof is reduced compared with that of a housing-encapsulated laser diode.

10. The distance measuring device as claimed in claim 1, wherein the transmitting unit is embodied without a monitor diode, and the laser diode driver is designed in such a way that the laser safety guidelines are fulfilled without a monitor diode.

11. A transmitting unit, for a high-frequency pulsed operation of a laser diode, as a preassembled assembly for the distance measuring device as claimed in claim 1, the transmitting unit comprising
    a printed circuit board as a carrier element,
    a laser diode driver as an electronic circuit, which is applied directly on the printed circuit board, and
    a semiconductor laser substrate without a housing, which substrate is applied directly on the printed circuit board.

12. A method for producing a transmitting unit as claimed in claim 11, the method comprising:
    directly applying the semiconductor light source as a laser substrate without a housing to the printed circuit board, and
    contact-connecting at least one electrical connection of the laser substrate onto the printed circuit board by using a die bonding process using at least one bonding wire.

13. The method as claimed in claim 12, wherein the semiconductor light source is applied with the semiconductor light source being positioned at the edge of a drilled hole of the printed circuit board.

14. A method for reducing an impedance of a semiconductor light source in a transmitting unit of an EDM for emitting high-frequency, steep-edged light pulses, wherein the method comprises:
applying the semiconductor light source as a laser substrate without a housing to a printed circuit board on which at least one part of a laser diode driver that drives the semiconductor light source is also applied.

15. The method as claimed in claim 14, further comprising directly contact-connecting at least one electrical connection of the laser substrate onto the printed circuit board by using a die bonding process using at least one bonding wire.

16. An optoelectronic distance measuring device, comprising:
a transmitting unit comprising a printed circuit board, a semiconductor laser and a laser diode driver, for emitting high-frequency intensity-modulated optical radiation,
a receiving unit for receiving a portion of the optical radiation, said portion being reflected from a target object, using a photosensitive electrical component with an electrical output signal as reception signal,
a conditioning unit for conditioning the reception signal
an analog-to-digital converter for digitizing the conditioned reception signal, and
an electronic evaluation unit, which ascertains a distance from the distance measuring device to the target object on the basis of a signal propagation time with the aid of the digitized reception signal,
wherein the semiconductor laser is applied as a laser substrate without a housing to the printed circuit board using an intermediate element.

17. The optoelectronic distance measuring device as claimed in claim 16, wherein the intermediate element is electrically insulating and has conductive structures which produce an electrical contact-connection between the printed circuit board and the laser substrate.

18. The optoelectronic distance measuring device as claimed in claim 17, wherein the intermediate element consists of silicon, silicon carbide or ceramic and concomitantly has metalized contact-connections.

19. The optoelectronic distance measuring device as claimed in claim 16, wherein the intermediate element is formed with the semiconductor laser as a prefabricated electronic component in the form of a surface mountable device (SMD).

20. The optoelectronic distance measuring device as claimed in claim 16, wherein the intermediate element is formed as an electronic component in the form of a surface mountable device (SMD) with contact pads fitted at the longitudinal ends as connections to the printed circuit board and a standard design from one of the SMD component series selected from the group consisting of 2512, 2010, 1218, 1210, 1206, 0805, 0603, 0402, 0201, and 01005.

21. The optoelectronic distance measuring device as claimed in claim 16, wherein the intermediate element is formed as an electronic component in the form of a surface mountable device (SMD) with ball grid array (BGA) contact-connections as connections to the printed circuit board.

22. The optoelectronic distance measuring device as claimed in claim 20, wherein the intermediate element has plated-through holes between the connections to the printed circuit board and at least one connection area of the semiconductor laser.

23. The optoelectronic distance measuring device as claimed in claim 21, wherein the semiconductor laser is applied on the same side of the intermediate element as the contact-connections of the BGA and this side is mounted as the underside facing toward the printed circuit board.

24. The optoelectronic distance measuring device as claimed in claim 16, wherein a first connection area of the semiconductor laser is applied on a first conductive area of the intermediate element and a second connection area— opposite the first —of the semiconductor laser is contact-connected onto a second conductive area of the intermediate element using a bonding wire.

25. The optoelectronic distance measuring device as claimed in claim 16, wherein the semiconductor laser is fitted by its connection areas on conductive areas on the intermediate element using flip-chip mounting.

26. The optoelectronic distance measuring device as claimed in claim 16, wherein the intermediate element with the semiconductor laser is fitted directly on the laser diode driver using package-on-package mounting.

27. The distance measuring device as claimed in claim 1, wherein the laser substrate is electrically connected to the printed circuit board or the laser diode driver using a bonding wire.

28. The distance measuring device as claimed in claim 3, wherein the laser substrate as a so-called flip-chip is contact-connectable electrically conductively onto the printed circuit board or the laser diode driver, specifically wherein the first connection and the second connection are provided with at least one ball contact and are adhesively bondable or solderable conductively onto the printed circuit board or the laser diode driver.

29. The distance measuring device as claimed in claim 4, wherein the laser substrate, as first connection, is adhesively bonded, bonded or soldered, electrically conductively onto the printed circuit board.

30. The optoelectronic distance measuring device as claimed in claim 23, wherein the semiconductor laser becomes located in a cutout formed at the edge of the printed circuit boards.

* * * * *